(12) United States Patent
Chou

(10) Patent No.: US 6,972,963 B1
(45) Date of Patent: Dec. 6, 2005

(54) ELECTRONIC APPARATUS HAVING STRUCTURE FOR PROTECTING FLEXIBLE PRINTED CIRCUIT AND CHIP THEREON

(75) Inventor: Pin-Hung Chou, Taipei (TW)

(73) Assignee: Chunghwa Picture Tubes, Taipei (TW)

( * ) Notice: Subject to any disclaimer, the term of this patent is extended or adjusted under 35 U.S.C. 154(b) by 0 days.

(21) Appl. No.: 10/710,345

(22) Filed: Jul. 2, 2004

(51) Int. Cl.⁷ .......................... H05K 7/02; H05K 7/20; H05K 1/18; G02F 1/1339
(52) U.S. Cl. ................ 361/760; 361/752; 361/800; 361/681; 361/749; 174/252; 174/254; 174/35 GC; 349/150
(58) Field of Search ......................... 361/728, 749, 361/752, 800, 807–810, 816, 817, 720, 712–715, 361/760, 767, 785, 789, 796, 799, 681, 687, 361/748, 719; 174/35 R, 35 GC, 35 MS, 174/198, 254, 252, 52.1, 50.6, 50.63; 349/58, 349/150

(56) References Cited

U.S. PATENT DOCUMENTS

| | | | |
|---|---|---|---|
| 5,606,440 A | * | 2/1997 | Kawaguchi et al. ........ 349/188 |
| 5,777,610 A | * | 7/1998 | Sugimoto et al. .......... 345/206 |
| 5,822,191 A | * | 10/1998 | Tagusa et al. .............. 361/751 |
| 6,104,464 A | * | 8/2000 | Adachi et al. ............. 349/150 |
| 6,342,932 B1 | * | 1/2002 | Terao et al. ................ 349/58 |
| 6,534,722 B2 | * | 3/2003 | Takaoka ................... 174/254 |
| 6,560,124 B1 | * | 5/2003 | Irie et al. ................... 361/816 |
| 6,677,664 B2 | * | 1/2004 | Inoue et al. ............... 257/668 |
| 6,703,702 B2 | * | 3/2004 | Inoue et al. ............... 257/684 |
| 6,774,872 B1 | * | 8/2004 | Kawada et al. ............ 345/60 |
| 6,813,159 B2 | * | 11/2004 | Irie et al. ................... 361/752 |
| 6,825,894 B2 | * | 11/2004 | Aoyagi et al. ............. 349/61 |
| 6,903,794 B2 | * | 6/2005 | Fukuta et al. ............. 349/150 |

* cited by examiner

Primary Examiner—Kamand Cuneo
Assistant Examiner—Dameon E. Levi
(74) Attorney, Agent, or Firm—Jianq Chyun IP Office

(57) ABSTRACT

An electronic apparatus having a structure for protecting a flexible printed circuit (FPC) and a chip thereon is described, including a metal backplate, a first circuit and a second circuit respectively on the front side and the back side of the backplate, a metal frame plate at the periphery of the backplate, at least one FPC with at least one chip thereon, a metal screen plate, and at least one insulating elastic ring disposed around the FPC. The FPC has a first end connected to the first circuit and a second end connected to the second circuit over the frame plate, and the screen plate is disposed on the frame plate screening the FPC and the chip. The inner periphery of the insulating elastic ring closely contacts with the chip, and the outer periphery of the ring closely contacts with the frame plate and the screen plate.

11 Claims, 2 Drawing Sheets

ELECTRONIC APPARATUS HAVING STRUCTURE FOR PROTECTING FLEXIBLE PRINTED CIRCUIT AND CHIP THEREON

BACKGROUND OF INVENTION

1. Field of the Invention

The present invention relates to an electronic apparatus. More particularly, the present invention relates to an electronic apparatus that has a structure for protecting a flexible printed circuit (FPC) in the electronic apparatus and a chip on the FPC.

2. Description of the Related Art

FPC is widely used in various electronic apparatuses, especially in planar displays like liquid-crystal display (LCD), plasma display and organic electro-luminescence display (OELD), to facilitate their fabrication. Referring to FIG. 1, in a fabricating process of a conventional plasma display, one end of each of several flexible printed circuits 11 is connected to corresponding control electrodes on the front or back substrate of a display panel 10. The display panel 10 is then fixed onto a metal backplate 12, which is disposed with a metal frame plate 121 at its periphery. Each FPC 11 is bent over the frame plate 121, so that the other end thereof can be connected to an insertion-type connector 131 on a control/driving circuit board 13 on the back side of the backplate 12.

Before a FPC 11 is bent over the frame plate 121, a thermally conductive silicone rubber pad 141 is pasted to the frame plate 121 facing the FPC 11. After the other end of each FPC 11 is connected to the control circuit board 13, another thermally conductive silicone rubber pad 142 is pasted to the outer peripheries of the FPCs 11 in a position corresponding to the silicone rubber pad 141. Thereafter, a metal screen plate 15 is fixed onto the frame plate 121 from the outer side of the thermally conductive silicone rubber pad 142.

Referring to FIG. 1 again, the metal screen plate 15 is for screening the FPCs 11 and the driving chips 111 thereon to protect them from electromagnetic interference, scratches and collision. Meanwhile, the thermally conductive silicone rubber pads 141 and 142 between the frame plate 121 and the screen plate 15 can conduct the heat generated by the driving chips 111 to the frame plate 121 and the screen plate 15. The silicone rubber pads 141 and 142 also have insulating and damping effect, so that the FPCs 11 and the driving chips 111 can be insulated from the frame plate 121 and the screen plate 15 and protected from rubbing against or colliding with the latter.

Nevertheless, the silicone rubber pad 141/142 is made from a semi-cured material, such as, catalized silicone rubber, that is quite expensive. Meanwhile, the silicone rubber pad 141/142 must have a length equal to the width (or length) of the display panel 10 and a certain thickness for intimately contacting with the frame plate 121, the driving chips 111 and the screen plate 15 to effect the thermal conduction. Moreover, in the assembling process, the operator must precisely paste the silicone rubber pads 141 and 142 to predetermined locations in accurate sequence, so as to effect the thermal conduction between the driving chips 111 and the frame plate 121/screen plate 15. Therefore, the assembling process of conventional plasma display is quite complicated, and the product easily fails due to negligence of the operator.

SUMMARY OF INVENTION

In view of the foregoing, the present invention provides an electronic apparatus that has a structure for protecting a FPC and a chip thereon. The protective structure cab be easily installed to the electronic apparatus to provide thermal conductivity and insulating/damping effect, and can be made at a reduced cost.

Another object of this invention is to provide a plasma display that has a structure for protecting a FPC therein and a chip on the FPC and for dissipating the heat generated by the chip.

The electronic apparatus of this invention includes a backplate, a first circuit and a second circuit respectively on the front side and the back side of the backplate, a frame plate, at least one flexible printed circuit (FPC) with at least one chip thereon, at least one insulating elastic ring and a screen plate. The frame plate is disposed at the periphery of the backplate. The FPC has a first end connected to the first circuit and a second end to the second circuit over the frame plate. The screen plate is disposed on the frame plate screening the FPC and the chip thereon. The insulating elastic ring is disposed around the FPC, while the inner periphery of the ring closely contacts with the chip and the outer periphery of the ring closely contacts with the frame plate and the screen plate.

In the electronic apparatus of this invention, the central hole of the insulating elastic ring at a relaxed state preferably has a size such that the ring is slightly expanded as being disposed around the FPC and therefore closely contacts with the chip on the FPC due to its elasticity. Moreover, the FPC preferably has a length exactly allowing the second end thereof to be bent to the back side of the backplate to connect with the second circuit, so that the outer periphery of the insulating elastic ring can closely contact with the frame plate.

In a preferred embodiment of this invention, the electronic apparatus is a plasma display, the first circuit is the electrode circuit of the display panel of the plasma display, and the second circuit is a driving circuit of the plasma display. At least one FPC is disposed at the periphery of the electrode circuit, wherein each FPC is disposed with at least one driving chip of the plasma display thereon.

As mentioned above, the inner periphery of the insulating elastic ring disposed around the FPC closely contacts with the chip, and the outer periphery of the ring closely contact with the frame plate and the screen plate. Therefore, the thermal conductivity between the chip and the frame/screen plate is good. Since such good thermal conductivity is achieved merely by disposing an insulating elastic ring around each FPC, the fabricating process of the electronic apparatus can be simplified.

Moreover, since the insulating elastic ring has a size such that it is slightly expanded as being disposed around the FPC, the insulating elastic ring can closely contact with the chip due to its elasticity. Therefore, the insulating elastic ring can be made thinner than the conventional thermally conductive silicone rubber pad from a cured material, such as, cured silicone rubber, that is cheaper than the semi-cured materials used in the prior art.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
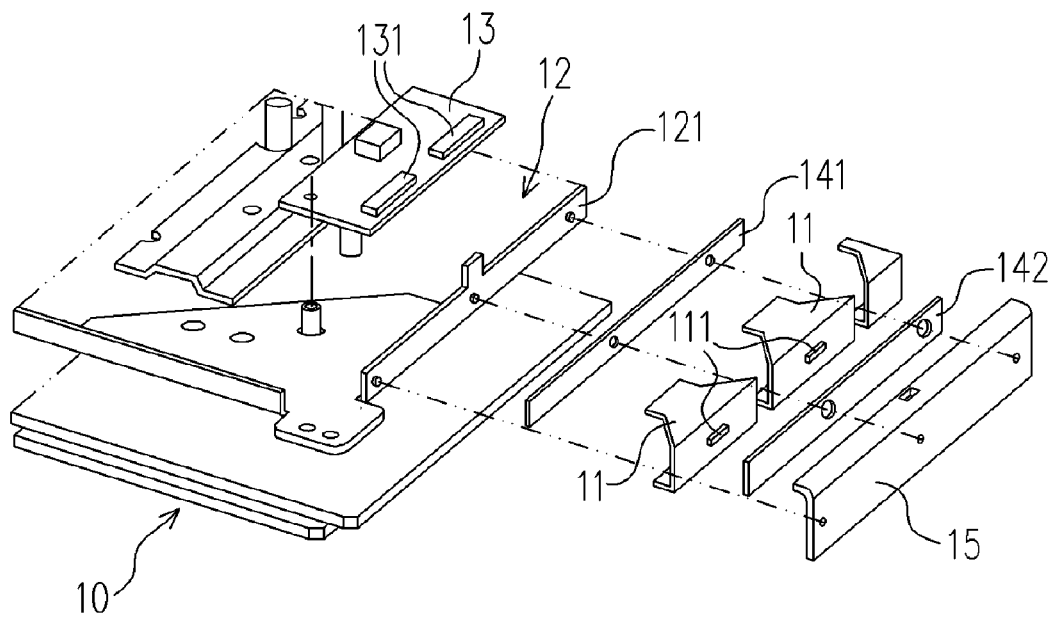
FIG. 1 illustrates an assembling process of a conventional plasma display in an exploded view.
Figure 2:
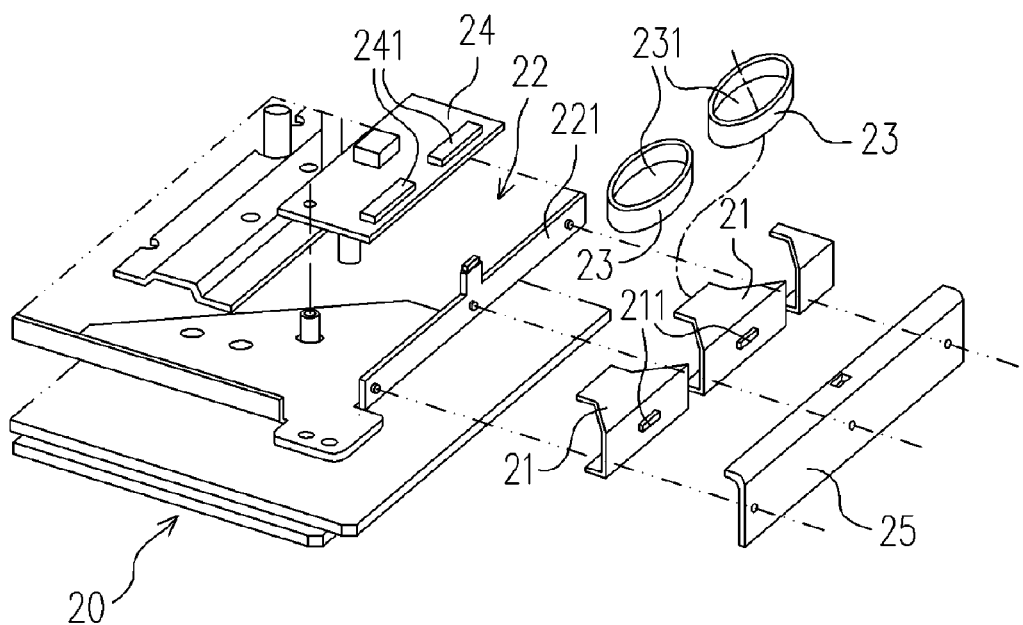
FIG. 2 illustrates an assembling process of a plasma display according to a preferred embodiment of this invention in an exploded view.
Figure 3:
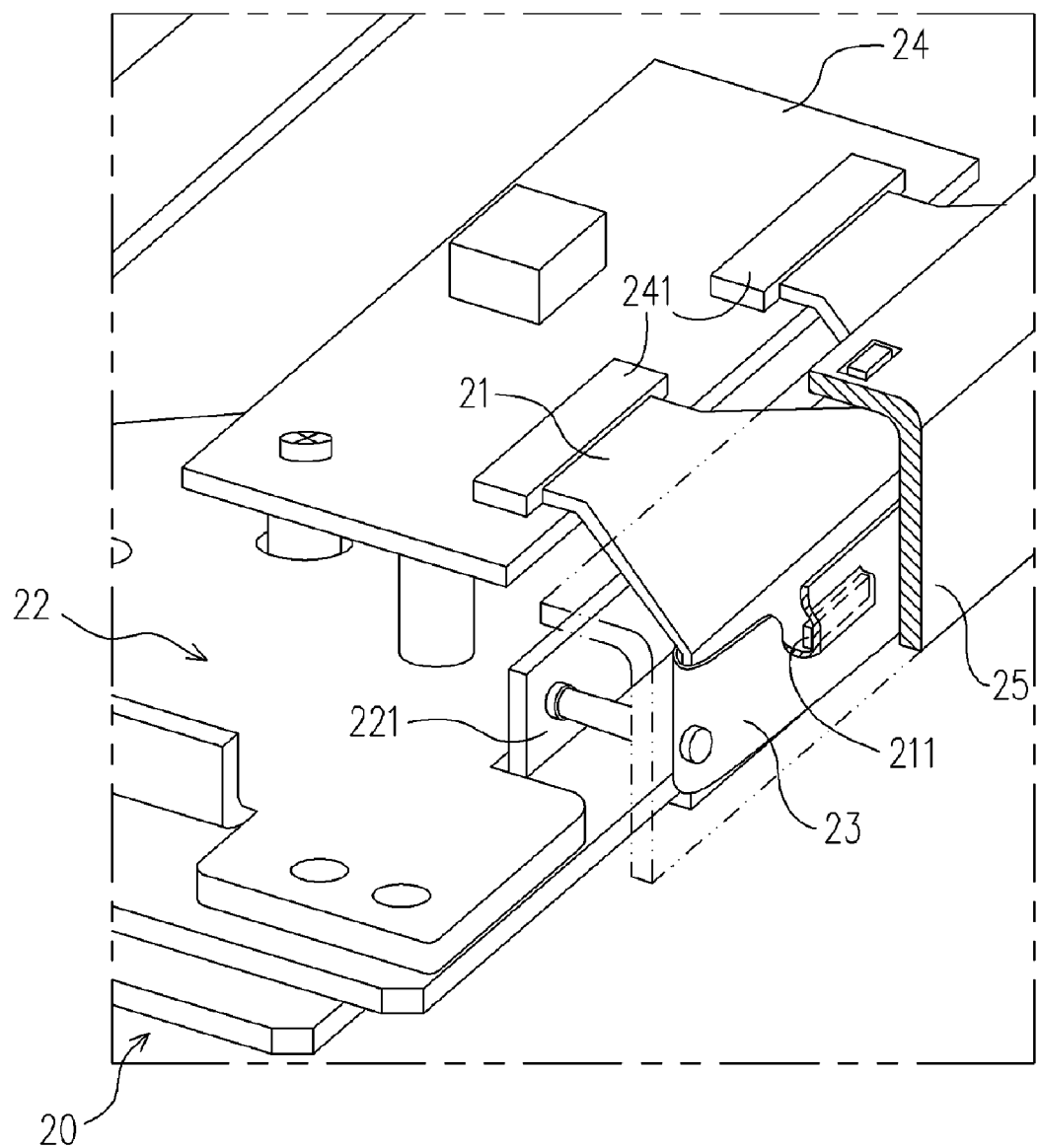
FIG. 3 illustrates a part of the plasma display according to the preferred embodiment of this invention, showing particularly the arrangement of the insulating elastic ring and other parts around it.

Referring to FIGS. 2 and 3, the plasma display according to the preferred embodiment includes a display panel 20 consisting of a front substrate and a back substrate. The common electrode and the scan electrodes of the display panel 20 are disposed on peripheral portions of the front substrate, and the data electrodes of the PDP 20 on the periphery portion of the back substrate. The electrodes on the display panel 20 are connected with one end of each of several flexible printed circuits 21, wherein each FPC 21 has a driving chip 211 thereon. Meanwhile, a metal backplate 22 is provided with a metal frame plate 221 disposed at the periphery thereof.

When the display panel 20 is disposed onto the front side of the metal backplate 22, each FPC 21 is right at the periphery of the backplate 22, and an insulating elastic ring 23 can be disposed around each FPC 21 from the other end of the FPC 21. The central hole 231 of the insulating elastic ring 23 at a relaxed state preferably has a size such that the ring 23 is slightly expanded as being disposed around the FPC 21 and therefore closely contacts with the chip 211 on the FPC 21 due to its elasticity. After the other end of each FPC 21 is connected to the back side of the metal backplate 22, a metal screen plate 25 is fixed onto the metal frame plate 221 screening the FPC 21 and the chip 211 thereon. The metal screen plate 25 is pressed onto the outer periphery of the insulating elastic ring 23.

Referring to FIG. 3, each FPC 21 preferably has a length exactly allowing the other end thereof to be bent to the back side of the metal backplate 22 to connect with a corresponding insertion-type connector 241 of the driving circuit 24 on the back side. Thereby, the outer periphery of the insulating elastic ring 23 facing the backplate 22 can closely contact with the frame plate 221 at the periphery of the backplate 22. The metal screen plate 25 is capable of screening the FPC 21 and the driving chip 211 thereon to protect them from electromagnetic interference and to prevent them from being damaged by scratches or collision.

Since the insulating elastic ring 23 can closely contact with the chip 211 on the FPC 21 due to its elasticity, the thickness of the ring 23 can be smaller than that of the conventional thermally conductive silicone rubber pad. Meanwhile, the insulating elastic ring 23 can be made from a cured material, such as, cured silicone rubber, that is cheaper than the semi-cured materials used in the prior art. Moreover, the distance between the frame plate 221 and the screen plate 25 can be further reduced, so that the insulating elastic ring 23 can contact with the driving chip 211, the metal frame plate 221 and the metal screen plate 25 more closely. Thereby, the thermal conductivity between the above parts can be further improved, and the heat generated from the chip 211 can be dissipated more rapidly to increase the lifetime of the chip 211 and the plasma display.

Furthermore, since an insulating elastic ring 23 can be easily and rapidly disposed around each FPC 21 without any complicated positioning operation and assembling sequence, the fabrication of the plasma display can be simplified to improve the product yield. In addition, since the insulating elastic ring 23 can be made thinner than the conventional silicone rubber pad, the distance between the frame plate 221 and the screen plate 25 can be further reduced to decrease the size of plasma display.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. An electronic apparatus having a structure for protecting a flexible printed circuit (FPC) and a chip thereon, comprising:
   a backplate;
   a first circuit, disposed on a front side of the backplate;
   a second circuit, disposed on a back side of the backplate;
   a frame plate, disposed at a periphery of the backplate;
   at least one FPC with at least one chip thereon, having a first end connected to the first circuit and a second end connected to the second circuit over the frame plate;
   a screen plate, disposed on the frame plate screening the FPC and the chip; and
   at least one insulating elastic ring disposed around the FPC, wherein an inner periphery of the ring closely contacts with the chip and an outer periphery of the ring closely contacts with the frame plate and the screen plate.

2. The electronic apparatus of claim 1, wherein the FPC has a length exactly allowing the second end thereof to be bent to the back side of the backplate to connect with the second circuit, so that the outer periphery of the insulating elastic ring can closely contact with the frame plate.

3. The electronic apparatus of claim 1, wherein a central hole of the insulating elastic ring at a relaxed state has a size such that the ring is slightly expanded as being disposed around the FPC.

4. The electronic apparatus of claim 1, wherein the insulating elastic ring comprises cured silicone rubber.

5. The electronic apparatus of claim 1, which is a plasma display.

6. The electronic apparatus of claim 5, wherein the first circuit comprises an electrode circuit on a display panel of the plasma display.

7. The electronic apparatus of claim 6, wherein the second circuit comprises a driving circuit of the plasma display.

8. The electronic apparatus of claim 7, wherein the FPC has a length exactly allowing the second end thereof to be bent to the back side of the backplate to connect with the driving circuit, so that the outer periphery of the insulating elastic ring can closely contact with the frame plate.

9. The electronic apparatus of claim 7, wherein the chip comprises a driving chip.

10. The electronic apparatus of claim 5, wherein a central hole of the insulating elastic ring at a relaxed state has a size such that the ring is slightly expanded as being disposed around the FPC.

11. The electronic apparatus of claim 5, wherein the insulating elastic ring comprises cured silicone rubber.

* * * * *